United States Patent
Shimada

(10) Patent No.: US 8,241,420 B2
(45) Date of Patent: Aug. 14, 2012

(54) SINGLE CRYSTAL MATERIAL AND PROCESS FOR PRODUCING THE SAME

(75) Inventor: Takeshi Shimada, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 1100 days.

(21) Appl. No.: 12/063,490

(22) PCT Filed: Aug. 11, 2005

(86) PCT No.: PCT/JP2005/014771
§ 371 (c)(1),
(2), (4) Date: Jun. 10, 2008

(87) PCT Pub. No.: WO2007/017951
PCT Pub. Date: Feb. 15, 2007

(65) Prior Publication Data
US 2009/0048090 A1    Feb. 19, 2009

(51) Int. Cl.
*C30B 29/22* (2006.01)
(52) U.S. Cl. ............... 117/13; 117/19; 117/37; 423/69; 423/592.1
(58) Field of Classification Search ............... 117/13.19, 117/37; 423/69, 592.1
See application file for complete search history.

(56) References Cited

U.S. PATENT DOCUMENTS 5,602,080 A    2/1997    Bednorz et al.

FOREIGN PATENT DOCUMENTS

JP    11-71171    3/1999

OTHER PUBLICATIONS

International Search Report issued in International Application No. PCT/JP2005/014771 on Nov. 8, 2005.
Vanderah et al., "Synthesis and Dielectric Properties of Substituted Lanthanum Aluminate," *J. Am. Ceram. Soc.*, 77 [12] 3125-30 (1994).
Nakamura et al., "On the Perovskite-Related Materials of High Dielectric Permittivity with Small Temperature Dependence and Low Dielectric Loss," *Ferroelectrics*, Vo. 196, pp. 205-209 (1997).
Tsuzuki et al., "High Temperature Superconducting Filter for Wireless Base Station," *MWE 2000 Microwave Workshop Digest*, pp. 337-340.
Office Action issued in corresponding European Application No. 05770312.6 dated Jul. 29, 2009.
Vanderah et al., "Synthesis and Dielectric Properties of Substituted Lanthanum Aluminate", Journal of the American Ceramic Society, vol. 77, No. 12, Jan. 1, 1994, XP-002158855, pp. 3125-3130.
Cho et al., Mixture-Like Behavior in the Microwave Dielectric Properties of the $(1-x)LaAlO_3$-$_xSrTiO_3$ System, Materials Research Bulletin, vol. 34, No. 4, 1999, XP-002536749, pp. 511-516.

*Primary Examiner* — Bob M Kunemund
(74) *Attorney, Agent, or Firm* — Stein McEwen, LLP

(57) ABSTRACT

The invention intends to provide a single crystal material that can be used as a dielectric material for use in electronic devices, which has a high Qf value; and a process for producing the same. According to the invention, a single crystal of a composite oxide is obtained from a composition in which a slight amount of $SrTiO_3$ is added to $LaAlO_3$, and the $(1-X)LaAlO_3$—$XSrTiO_3$ single crystal material having the specific composition has such dielectric characteristics for electronic devices that the dielectric constant is 24 or more and the Qf value is 300,000 GHz or more, is considerably improved in the Qf value as a dielectric material, and can be applied to a high-temperature superconducting filter.

5 Claims, No Drawings

SINGLE CRYSTAL MATERIAL AND PROCESS FOR PRODUCING THE SAME

CROSS-REFERENCE TO RELATED APPLICATIONS

This application claims the benefit of PCT International Patent Application No. PCT/JP2005/014771, filed Aug. 11, 2005, and is related to Japanese Patent Application No. 2004-146344, filed May 17, 2004, in the Japanese Patent Office, the disclosures of which are incorporated herein by reference.

TECHNICAL FIELD

The invention relates to a composite oxide single crystal material having characteristics of a dielectric for use in electronic devices, which is used in a communication filter, an oscillator or the like in a sub-micrometer wave or a micrometer and millimeter wave region; and a process for producing the same.

BACKGROUND ART

Dielectric materials has been widely used in a region of a high frequency wave such as a micrometer wave or a millimeter wave. As the characteristics required for the dielectric materials, in particular, small dielectric loss in a high frequency wave region, that is, a high Qf value is required.

As such a dielectric material for use in a high frequency wave, $LaAlO_3$—$SrTiO_3$ dielectric porcelain has been proposed (see, patent document 1). This material can be obtained by calcining oxide powders as raw materials, followed by pulverization, forming and sintering thereof, and the structure thereof is a polycrystalline structure containing a perovskite crystal composed of a $LaAlO_3$—$SrTiO_3$ solid solution as a main phase.

On the other hand, as a material used in a high-temperature superconducting filter for use in high frequency wave and so on, MgO single crystal and $LaAlO_3$ single crystal has been known (see, non-patent document 1).

Patent document 1: JP-A-11-71171
Non-patent document 1: MWE 2000 Microwave Workshop Digest 337-340 "High Temperature Supersonducting Filer for Wireless Base Station"

DISCLOSURE OF INVENTION

Problem that the Invention is to Solve

In recent years, as a trend toward a higher frequency wave in a communication frequency proceeds, reduction of loss in electronic devices has been required. Furthermore, in a high frequency wave band of a sub-millimeter wave or more, since the loss of dielectrics significantly affects on the loss of electronic devices, dielectric materials have been desired to have a higher Qf value.

However, although the $LaAlO_3$—$SrTiO_3$ dielectric porcelain according to the patent document 1 has a high Qf value, since it is a polycrystalline body, it cannot be used in a high-temperature superconducting filter.

Furthermore, there is a problem that, since MgO single crystal easily reacts with moisture in atmosphere to be deteriorated, the endurance thereof is poor. Still furthermore, there is also a problem that, although $LaAlO_3$ single crystal is excellent in the endurance, the present Qf value thereof is lower than that of MgO single crystal.

The invention intends to provide a dielectric material for electronic devices, which can overcome the problems of conventional dielectric materials and has a high Qf value; and a process for producing the same.

Means for Solving the Problem

For the purpose of developing a dielectric material for use in electronic devices having a high Qf value, the inventors have made intensive studies on the $LaAlO_3$—$SrTiO_3$ dielectric porcelain, and as a result, they found that a single crystal of a composite oxide can be obtained from a composition in which a slight amount of $SrTiO_3$ is added to $LaAlO_3$, and the $(1-X)LaAlO_3$—$XSrTiO_3$ single crystal material having the specific composition can be considerably improved in the Qf value as a dielectric material and can be applied to a high-temperature superconducting filter, whereby the invention has been completed.

That is, the invention relates to a single crystal material, which is a single crystal of a composite oxide having a composition formula represented by $(1-X)LaAlO_3$—$XSrTiO_3$ in which X satisfies $0<X\leq0.2$; and relates to a single crystal material having such dielectric characteristics for electronic devices that the dielectric constant is 24 or more and the Qf value is 300,000 GHz or more.

Furthermore, the invention relates to a process for producing a single crystal material, which includes growing a single crystal of a composite oxide from a sintered body or a melt having a composition formula represented by $(1-X)LaAlO_3$—$XSrTiO_3$, in which X satisfies $0<X\leq0.2$, in accordance with the floating zone method (hereinafter, referred to as FZ method) or the Czochralski method (hereinafter, referred to as CZ method), the process further being carried out in an inert gas atmosphere or employing a $LaAlO_3$ single crystal as a seed crystal.

Advantage of the Invention

According to the invention, a single crystal material of a composite oxide can be readily produced in accordance with the FZ method or the CZ method, and this single crystal material has a high Qf value and is optimal for a dielectric material for use in electronic devices.

According to the invention, when a (110) plane of the single crystal is taken as an electric field surface, the single crystal material of a composite oxide may have a higher Qf value, and when it is used in a high-temperature superconducting filter or the like, the loss of the device can be considerably reduced.

BEST MODE FOR CARRYING OUT THE INVENTION

The single crystal material of the invention is a single crystal obtained by doping a specific amount of $SrTiO_3$ into $LaAlO_3$, which is considerably improved in the Qf value of the dielectric characteristics in comparison with that of conventional $LaAlO_3$ single crystal and has a composition formula represented by $(1-X)LaAlO_3$—$XSrTiO_3$ in which X satisfies $0<X\leq0.2$.

In a composition formula of $(1-X)LaAlO_3$—$XSrTiO_3$, when X is zero, the Qf value cannot be unfavorably improved and, when X exceeds 0.2, a single crystal is not unfavorably formed and the improvement on Qf value cannot be expected. A more preferred range thereof is $0.075\leq X\leq0.2$ According to the process for producing a single crystal material of the invention, a known method such as the FZ method or the CZ method is employed for growing a single crystal of a composite oxide from a sintered body or a melt.

When the FZ method is employed, it includes (a) a step of preparing a sintered body having a composition formula represented by $(1-X)LaAlO_3$—$XSrTiO_3$ in which X satisfies $0<X\leq0.2$; (b) a step of oppositely disposing a seed crystal below the sintered body; (c) a step of heating and melting the sintered body and the seed crystal; (d) a step of bringing the sintered body and seed crystal into contact with each other; and (e) a step of pulling down the seed crystal while rotating the same.

In the FZ method, the sintered body in the step (a) of preparing a sintered body necessarily satisfies a composition formula based on the above-mentioned limiting reasons. As the step of preparing the sintered body, a production process such as shown below can be adopted.

(1) The respective oxide powders as starting raw materials are weighed so as to be a desired ratio.

(2) Pure water or alcohol is added to the respective oxide powders, followed by mixing and pulverizing them.

(3) The mixed powder is calcined.

(4) The calcined powder is pulverized.

(5) The pulverized powder is formed by means of desired forming means.

(6) The green compact is sintered.

As a preferable embodiment in the preparing step (a), an average particle diameter of a mixed powder after mixing and pulverizing in the step (2) is preferably in the range of 0.7 to 1.4 μm. In the step (3), a sintering temperature is preferably in the range of 1100 to 1400° C. and a calcination period is preferably in the range of 2 to 6 hr. An average particle diameter of a pulverized powder in the step (4) is preferably in the range of 0.8 to 4.0 μm. A forming density in the step (5) is preferably in the range of 3.0 to 5.2 g/cm³. In the step (6), sintering atmosphere is preferably in air or in an atmosphere having an oxygen concentration in the range of 50 to 100%, a sintering temperature is preferably in the range of 1500 to 1700° C., more preferably 1550 to 1650° C., and a sintering period is preferably in the range of 1 to 50 hr. When these favorable conditions are selected, the Qf value of the obtained dielectric single crystal for use in electronic devices can be improved.

In the FZ method, the sintered body and seed crystal are desirably fixed to an apparatus using a platinum wire. When a platinum wire is used, reaction of platinum with the sintered body and seed crystal can be inhibited. In the steps (b) through (e) in the FZ method, known means can be appropriately adopted.

In the case of the CZ method, it includes (i) a step of preparing a raw material having a composition formula represented by $(1-X)LaAlO_3$—$XSrTiO_3$ in which X satisfies $0<X\leq0.2$; (ii) a step of putting a raw material in a crucible, followed by heating to obtain a melt; (iii) a step of bringing a seed crystal into contact with the melt; and (iv) a step of pulling up the seed crystal while rotating.

In the CZ method, a seed crystal is preferably fixed to an apparatus with a platinum wire. When a platinum wire is used, a reaction with the seed crystal can be inhibited. In the steps (ii) through (iv) in the CZ method, known means can be appropriately adopted.

In the process for producing a single crystal material according to the invention, the FZ method and the CZ method are preferably carried out in an inert gas atmosphere. By carrying out in an inert gas atmosphere, the Qf value can be further increased, as well as damage on a crucible can be inhibited and reaction of a fixing platinum wire can be inhibited. As an inert gas, nitrogen, argon, helium or the like can be preferably used.

In the FZ method and the CZ method, a $LaAlO_3$ single crystal is preferably used as a seed crystal. When a $LaAlO_3$ single crystal is used as a seed crystal, a homogeneous $(1-X)LaAlO_3$—$XSrTiO_3$ single crystal can be obtained. It goes without saying that a grown $(1-X)LaAlO_3$—$XSrTiO_3$ single crystal as well can be used as a seed crystal.

The single crystal material having a composition formula represented by $(1-X)LaAlO_3$—$XSrTiO_3$ in which X satisfies $0<X\leq0.2$, which is obtained in accordance with the production process as mentioned above, has a high Qf value as a dielectric material for use in electronic devices. When a (110) plane of the single crystal is taken as an electric field surface, the Qf value can be further improved. In order to make a (110) plane an electric field surface, a crystal plane of a single crystal material is specified by means of, for instance, an X-ray diffraction method and, based thereon, a cutting operation may well be carried out.

EXAMPLES

Example 1

As starting materials, powders of $La_2O_3$, $Al_2O_3$, $SrCO_3$ and $TiO_2$ were prepared. These powders were concocted so that X in a composition formula represented by $(1-X)LaAlO_3$—$XSrTiO_3$ may be 0, 0.025, 0.05, 0.075, 0.1, 0.2 or 0.3, respectively, mixed in pure water and then dried to thereby obtain mixed powders having an average particle diameter of 1.1 μm.

In the next place, the mixed powders each were calcined at 1400° C. for 4 hr depending on the compositions thereof. Each of the calcined powders thus obtained was pulverized by a wet process until a center particle diameter became 1.7 μm, followed by drying the pulverized powder. Then, PVA was added to and mixed with each of the dried powder, followed by granulating by means of a granulating device.

The granulated powders thus obtained were formed by use of a uniaxial press machine to the forming density of 3.5 g/cm³. The green compacts thus obtained each were degreased at a temperature in the range of 300 to 700° C., followed by sintering in an atmosphere having an oxygen concentration of 80% at 1650° C. for 10 hr, thereby obtaining sintered bodies.

Each of the obtained sintered bodies was treated in accordance with the FZ method in an inert gas atmosphere to thereby produce a single crystal. Specifically, an sintered body was processed into a size of φ 5 mm×10 mm and fixed to an infrared heater using a platinum wire. Furthermore, a $LaAlO_3$ single crystal was fixed to a lower portion of the sintered body as a seed crystal and both were melted by use of an infrared image furnace. After melting, the sintered body and the seed crystal were brought into contact with each other, and, with both rotating in opposite directions from each other, the seed crystal was pulled down to grow a single crystal of composite oxide.

The single crystals of composite oxides thus obtained each were processed into a size of φ 5 mm×3 mm to thereby obtain test pieces. The test pieces thus obtained were measured of the dielectric constant, Qf value and τf value in accordance with the H&C method using a network analyzer. Measurement results are shown in Table 1. In Table 1, those provided with a * mark next to a number are comparative examples, in which X is 0 or 0.3.

Example 2

Except that the FZ method was carried out in an oxygen atmosphere, single crystals of composite oxide were produced in accordance with a similar process of example 1. The single crystals thus obtained each were processed into a size of φ 5 mm×3 mm to thereby obtain test pieces. According to a method similar to that of example 1, the test pieces thus obtained each were measured of the dielectric constant, Qf value and τf value. Measurement results are shown in Table 2. In Table 2, those provided with a * mark next to a number are comparative examples, in which X is 0 or 0.3.

As obvious from Tables 1 and 2, single crystals of composite oxide according to the invention are considerably improved in the Qf value in comparison with that of comparative examples and are particularly remarkably improved in the range of $0.075 \leq X \leq 0.2$. Furthermore, it is found that, when a crystal plane is a (110) plane, the Qf value is improved.

Furthermore, as in example 2, even when the FZ method is carried out in an oxygen atmosphere, excellent Qf value can be obtained. However, as in example 1, when the FZ method is carried out in an inert gas atmosphere, the Qf value can be further improved.

Example 3

As starting materials, powders of $La_2O_3$, $Al_2O_3$, $SrCO_3$ and $TiO_2$ were prepared. The powders were concocted so that X in a composition formula represented by $(1-X)LaAlO_3$—$XSrTiO_3$ may be 0, 0.025, 0.05, 0.075, 0.1, 0.2 or 0.3, respectively, mixed in pure water and then dried to thereby obtain mixed powders having an average particle diameter of 1.1 μm.

Each of the mixed powders thus obtained was treated in accordance with the CZ method in an inert gas atmosphere to thereby produce a single crystal. Specifically, each of the mixed powders thus obtained was put in a crucible, heated by high-frequency induction in an inert gas atmosphere to form a melt, followed by bringing a $LaAlO_3$ single crystal as a seed crystal into contact with the melt, further followed by pulling up the seed crystal while rotating to thereby grow a single crystal of composite oxide.

The single crystals of composite oxide thus obtained each were processed into a size of φ 5 mm×3 mm to thereby obtaining test pieces. The test pieces thus obtained were measured of the dielectric constant, Qf value and τf value in accordance with the H&C method using a network analyzer. Measurement results were confirmed to show the characteristics identical to those of the respective test pieces shown in Table 1 of example 1.

TABLE 1

| No. | Crystal Plane | X | εr | Qf (GHz) | τf (ppm/° C.) | Structure |
| --- | --- | --- | --- | --- | --- | --- |
| 1* | (100) | 0.000 | 24.11 | 294439 | −53.50 | single crystal |
| 2 | | 0.025 | 24.98 | 360491 | −52.31 | single crystal |
| 3 | | 0.050 | 25.62 | 432866 | −50.22 | single crystal |
| 4 | | 0.075 | 26.40 | 538422 | −49.25 | single crystal |
| 5 | | 0.100 | 27.12 | 649554 | −48.93 | single crystal |
| 6 | | 0.200 | 30.19 | 566237 | −47.88 | single crystal |
| 7* | | 0.300 | 33.11 | 512618 | −42.97 | polycrystal |
| 8* | (110) | 0.000 | 23.98 | 509343 | −55.90 | single crystal |
| 9 | | 0.025 | 24.70 | 612347 | −53.87 | single crystal |
| 10 | | 0.050 | 25.44 | 743962 | −53.01 | single crystal |
| 11 | | 0.075 | 26.08 | 869217 | −51.93 | single crystal |
| 12 | | 0.100 | 26.97 | 995825 | −50.78 | single crystal |
| 13 | | 0.200 | 29.99 | 971419 | −49.49 | single crystal |
| 14* | | 0.300 | 32.92 | 846764 | −44.20 | polycrystal |
| 15* | (111) | 0.000 | 24.12 | 402445 | −52.10 | single crystal |
| 16 | | 0.025 | 24.87 | 583629 | −51.62 | single crystal |
| 17 | | 0.050 | 25.60 | 637841 | −50.01 | single crystal |
| 18 | | 0.075 | 26.29 | 752843 | −48.77 | single crystal |
| 19 | | 0.100 | 27.10 | 895159 | −47.81 | single crystal |

TABLE 1-continued

| No. | Crystal Plane | X | εr | Qf (GHz) | τf (ppm/° C.) | Structure |
| --- | --- | --- | --- | --- | --- | --- |
| 20 | | 0.200 | 30.20 | 794952 | −46.48 | single crystal |
| 21* | | 0.300 | 33.14 | 680556 | −41.72 | polycrystal |

TABLE 2

| No. | Crystal Plane | X | εr | Qf (GHz) | τf (ppm/° C.) | Structure |
| --- | --- | --- | --- | --- | --- | --- |
| 22* | (100) | 0.000 | 24.11 | 294439 | −53.80 | single crystal |
| 23 | | 0.025 | 25.41 | 306996 | −52.61 | single crystal |
| 24 | | 0.050 | 26.69 | 322232 | −50.32 | single crystal |
| 25 | | 0.075 | 28.04 | 333613 | −49.48 | single crystal |
| 26 | | 0.100 | 29.29 | 348026 | −48.88 | single crystal |
| 27 | | 0.200 | 31.10 | 392889 | −47.79 | single crystal |
| 28* | | 0.300 | 33.63 | 336777 | −42.35 | polycrystal |
| 29* | (110) | 0.000 | 23.98 | 509343 | −55.97 | single crystal |
| 30 | | 0.025 | 25.25 | 529251 | −55.02 | single crystal |
| 31 | | 0.050 | 26.56 | 554695 | −53.41 | single crystal |
| 32 | | 0.075 | 27.88 | 578868 | −52.23 | single crystal |
| 33 | | 0.100 | 29.13 | 602049 | −50.81 | single crystal |
| 34 | | 0.200 | 30.92 | 678936 | −49.37 | single crystal |
| 35* | | 0.300 | 33.42 | 579120 | −44.49 | polycrystal |
| 36* | (111) | 0.000 | 24.12 | 402445 | −52.80 | single crystal |
| 37 | | 0.025 | 25.39 | 418765 | −51.59 | single crystal |
| 38 | | 0.050 | 26.71 | 439067 | −50.21 | single crystal |
| 39 | | 0.075 | 27.97 | 455461 | −49.06 | single crystal |
| 40 | | 0.100 | 29.28 | 475690 | −47.77 | single crystal |
| 41 | | 0.200 | 31.11 | 544654 | −46.24 | single crystal |
| 42* | | 0.300 | 33.60 | 458580 | −41.63 | polycrystal |

INDUSTRIAL APPLICABILITY

According to the invention, since a single crystal material of a composite oxide can be readily produced in accordance with the FZ method or the CZ method, and a dielectric single crystal for use in electronic devices, which has been recently required to be high in the Qf value, can be obtained; it is suitable for a communication filter in a sub-microwave or a micrometer wave and millimeter wave region, an oscillator and the like, in particular, for a high-temperature superconducting filter in a sub-millimeter wave band, and it can improve the performance of the electronic devices.

The invention claimed is:

1. A single crystal material, which is a single crystal of a composite oxide having a composition formula represented by $(1-X)LaAlO_3$—$XSrTiO_3$, wherein X satisfies $0<X \leq 0.2$.

2. The single crystal material according to claim 1, which has such dielectric characteristics for electronic devices that dielectric constant is 24 or more and Qf value is 300,000 GHz or more.

3. A process for producing a single crystal material, which comprises growing a single crystal of a composite oxide from a sintered body or a melt having a composition formula represented by $(1-X)LaAlO_3$—$XSrTiO_3$, wherein X satisfies $0<X \leq 0.2$, in accordance with the floating zone method or the Czochralski method.

4. The process for producing a single crystal material according to claim 3, wherein the floating zone method or the Czochralski method is carried out in an inert gas atmosphere.

5. The process for producing a single crystal material according to claim 3, wherein a $LaAlO_3$ single crystal is used as a seed crystal.

* * * * *